United States Patent [19]
Yamawaki et al.

[11] 4,069,009
[45] Jan. 17, 1978

[54] APPARATUS FOR TRANSFERRING SEMICONDUCTOR WAFERS

[75] Inventors: Masao Yamawaki, Handa; Katsuo Aoki, Aichi; Yoshio Oka, Toyota; Takao Suzuki, Kariya; Osamu Ina, Okazaki; Kinihiko Hara, Kariya, all of Japan

[73] Assignee: Nippondenso Co., Ltd., Kariya, Japan

[21] Appl. No.: 730,720

[22] Filed: Oct. 8, 1976

[30] Foreign Application Priority Data

Oct. 9, 1975 Japan ............................... 50-122111

[51] Int. Cl.$^2$ ............................................ F27B 9/14

[52] U.S. Cl. .................................... 432/122; 198/774; 432/258

[58] Field of Search ....................... 432/121, 122, 258; 198/773, 774, 776

[56] References Cited

U.S. PATENT DOCUMENTS

| | | | |
|---|---|---|---|
| 3,455,433 | 7/1969 | Gentry | 198/774 |
| 3,776,351 | 12/1973 | Erb | 198/776 |
| 3,811,825 | 5/1974 | Enderlein | 432/122 |
| 3,820,946 | 6/1974 | Miyoshi et al. | 432/121 |
| 3,948,494 | 4/1976 | Werych | 432/122 |
| 3,998,333 | 12/1976 | Kamada | 432/258 |

*Primary Examiner*—John J. Camby
*Attorney, Agent, or Firm*—Cushman, Darby & Cushman

[57] ABSTRACT

An apparatus for automatically transferring semiconductor wafers is disclosed. Semiconductor wafers are loaded on a boat which is placed on a pair of first supporting bars. A pair of second supporting bars are driven by a motor to repeat circular motion between the first supporting bars. The second supporting bars, circularly moving in parallel with the first supporting bars, forwardly transfer the boat. The boat is kept uplifted over the first supporting bars during the forward transfer thereof. Repetition of the circular motion of the second supporting bars makes the automatic transfer of the semiconductor wafers to be heat-treated in a semiconductor manufacturing system.

10 Claims, 10 Drawing Figures

FIG. 1-(a)
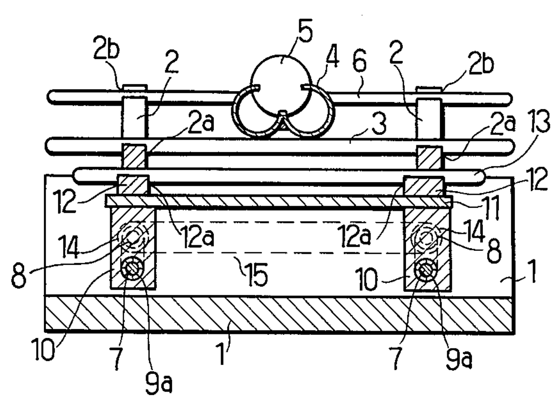
FIG. 1-(b)
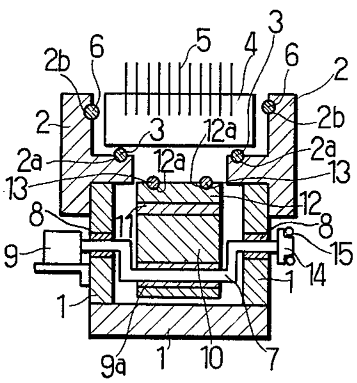
FIG. 2-(a)
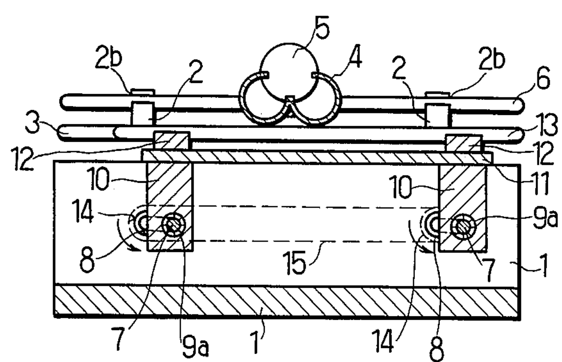
FIG. 2-(b)
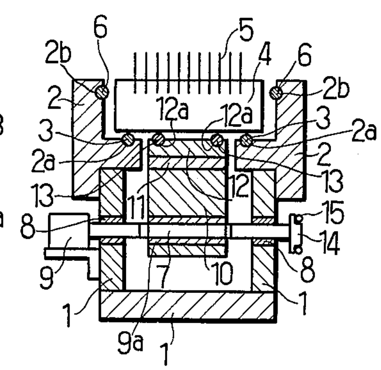

FIG. 3-(a)
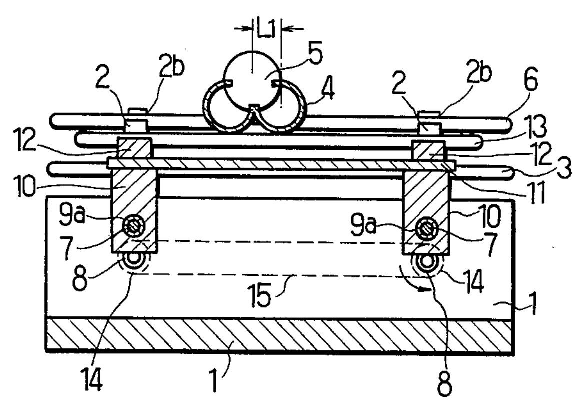
FIG. 3-(b)
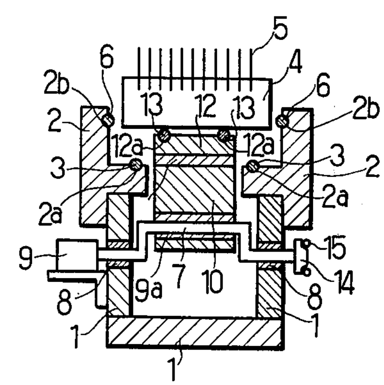
FIG. 4-(a)
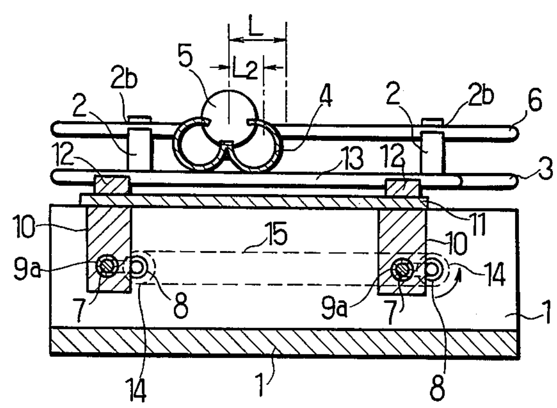
FIG. 4-(b)
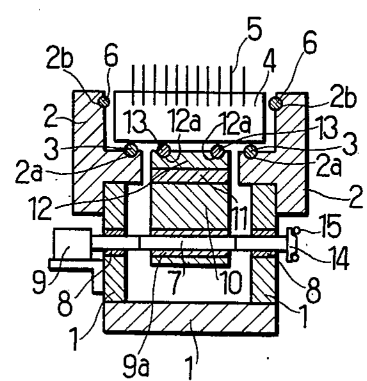

APPARATUS FOR TRANSFERRING SEMICONDUCTOR WAFERS

BACKGROUND OF THE INVENTION

The present invention relates to an apparatus for automatically transferring semiconductor wafers in a semiconductor manufacturing system.

It is a well-known matter that semiconductor wafers are washed, centrifugally dried and diffused in a semiconductor manufacturing system, more particularly in a heat-treatment process. The semiconductor wafers have been handled manually in each washing, drying and diffusing processes and transferred manually from one process to the other. The semiconductor wafers, therefore, are apt to be damaged during these processes and require more working forces to be heat-treated.

SUMMARY OF THE INVENTION

It is therefore a primary object of this invention to automatically transfer semiconductor wafers.

It is another object of this invention to transfer semiconductor wafers due to motor-driven unit.

It is a further object of this invention to prevent semiconductor wafers from being damaged during the transfer thereof.

It is a still further object of this invention to make a transferring apparatus washable.

BRIEF DESCRIPTION OF THE DRAWINGS

In the drawings:

FIGS. 1 through 4 are schematic views illustrating an apparatus for transferring semiconductor wafers in the preferred embodiment of the present invention, wherein FIG. 1 (*a*) and (*b*) are respectively a cross-sectional plan view and a cross-sectional side view of the apparatus at the crank bottom dead center position;

FIG. 2 (*a*) and (*b*) are respectively a cross-sectional plan view and a cross-sectional side view of the apparatus at the crank horizontal position;

FIG. 3 (*a*) and (*b*) are respectively a cross-sectional plan view and a cross-sectional side view of the apparatus at the crank top dead center position; and FIG. 4(*a*) and (*b*) are respectively a cross-sectional plan view and cross-sectional side view of the apparatus at the crank horizontal position:

DETAILED DESCRIPTION OF THE PREFERRED EMBODIMENT

Figure 5:
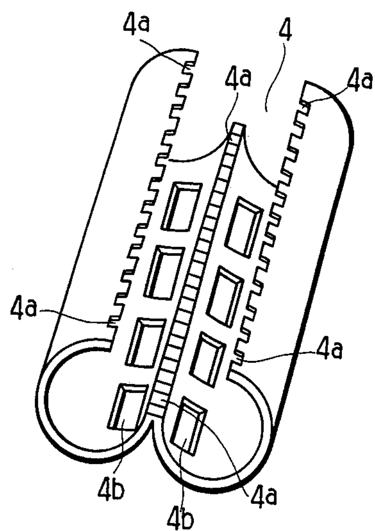
FIG. 5 is a perspective view of a boat used in the preferred embodiment.

The present invention is described hereinunder with reference to the embodiment shown in FIGS. 1 through 4. Reference numeral 1 designates a first body having U-shaped cross section and 2 second bodies fixed to side walls of the first body 1. Each second body 2 is provided, on the bottom surface, with a groove **2*a* into which a first supporting bar 3 is detachably inserted. The first supporting bar 3 is made of the material, e.g. the Teflon (trade mark) resin which is resistive to the strong acid such as aqua regia, and is so inserted as to be taken into and away from the second body 2**.

Numeral 4 designates a boat on which semiconductor wafers 5 are loaded. The boat 4 is made of the quartz and is positioned on a pair of first supporting bars 3. As fully illustrated in FIG. 5, the boat 4 is shaped into the numerical character "3" in cross-section and is provided longitudinally with a plurality of slits **4*a* on the central portion and the both end portions thereof so that semiconductor wafers 5 may be supported therein. The boat 4 is further formed with a plurality of windows 4*b*** in the circular wall through which heat-treating gas passes during that diffusion process.

Referring back to FIGS. 1 through 4, each second body 2 is further provided, on the vertical surface thereof, with a groove **2*b* into which a guide bar 6 is detachably inserted. A pair of guide bars 6 are made of Teflon resin and guide the transfer of the boat 4 which is transferred over the pair of supporting bars 3**.

A pair of crankshafts 7 are rotatably coupled to the first body 1 by means of respective bearings 8. The configuration of the crankshafts 7 is so determined as shown in (*b*) of FIG. 1. Either one of the crankshafts 7 is coupled to a retarder motor 9, as shown in (*b*) of FIGS. 1 through 4, to be rotated thereby. A pair of crankshafts 7 are interconnected by a chain 15 which engages with respective sprocket wheels 14 coupled to the crankshafts 7. Rotation of the two crankshafts 7, one being motor-driven and the other being chain-driven, is therefore synchronous.

Rotatably coupled to the central portion of the crankshafts 7 by means of respective bearing **9*a* are bearing blocks 10. A pair of bearing blocks 10 are interconnected by a connecting plate 11. A pair of supportng blocks 12 are securely positioned on the connecting plate 11 and are provided with a pair of grooves 12*a* into which second supporting bars 13 are respectively inserted. The second supporting bars 13 are made of Teflon resin and are detachable from the supporting blocks 12. Lateral length or width of the bearing blocks 10, the connecting plate 11 and the supporting blocks 12 are designed narrower than that between the two first supporting bars 3 so that the motor-driven unit may move through the space defined by the two second bodies 2**.

The motor 9, the crankshafts 7, the bearing blocks 10, the connecting plate 11 and the supporting blocks 12 constitute actuating means for circularly actuating the second supporting bars 13. The second supporting bars 13 are moved, as a result, upwardly, forwardly, downwardly and backwardly. The second supporting bars 13, moving over the first supporting bars 3, transfer the boat 4 forwardly in each circular motion.

Operation of the above-described apparatus is described next. When the crankshafts 7 are in the bottom dead center position as shown in (*a*) and (*b*) of FIG. 1, the second supporting bars 13 remain lower than the first supporting bars 3. The crankshafts 7 are rotated by the motor 9 in a counter-clockwise direction as shown in (*a*) of FIG. 2 and the bearing blocks 10, the connecting plate 11, the supporting blocks 12 and the second supporting bars 13 make circular motion. Due to the rotation of the crankshafts 7 from the bottom dead center, the second supporting bars 13 move upwardly and come to contact with the boat 4 as shown in (*a*) and (*b*) of FIG. 2 which illustrate that second supporting bars 13 remain horizontal to the first supporting bars 3.

The crankshafts 7 are further rotated to move the second supporting bars 13 upwardly and forwardly. The boat 4, as a result, is lifted up over the first supporting bars 3 and is transferred forwardly. When the crankshafts 7 are rotated to the top dead center as shown in (*b*) of FIG. 3, the boat 4 is transferred by the distance $L_1$ as shown (*a*) of FIG. 3 with respect to the stationary position shown in (*a*) of FIG. 2.

Further rotation of the crankshafts 7 causes the second supporting bars 13 to move downwardly and forwardly. The boat 4 is also moved downwardly and forwardly until when the second supporting bars 13 becomes horizontal to the first supporting bars 3 as shown in (*b*) of FIG. 4. During this quarter circular motion, the boat 4 is further transferred by the distance $L_2$ as shown in (*a*) of FIG. 4.

The crankshafts 7 and the second supporting bars 13, then, make downward and backward motion until the crankshafts 7 rotate to the bottom dead center again as shown in (*a*) and (*b*) of FIG. 1. The boat 4 is not transferred any more during this quarter circular motion, because the second supporting bars 13 moves lower than the first supporting bars 3.

Figure 6:
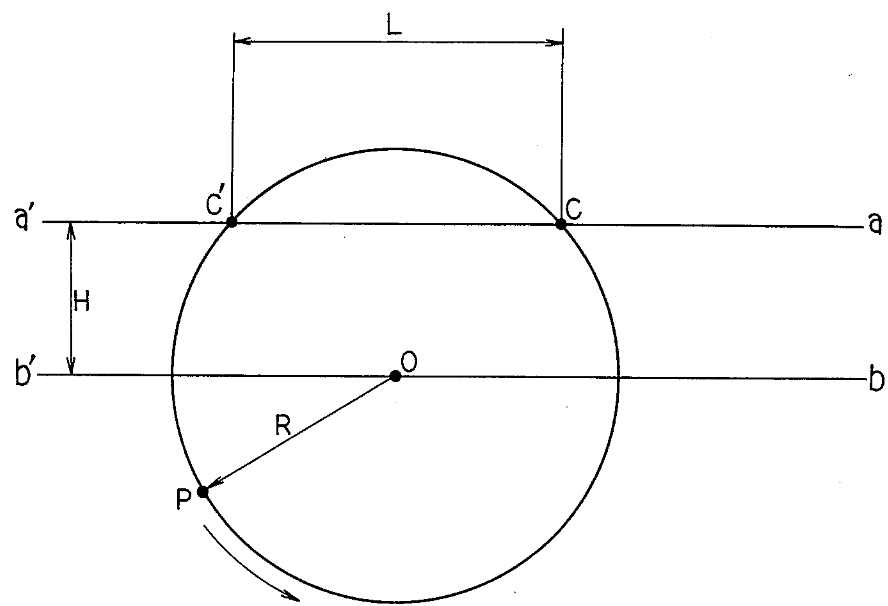
FIG. 6 is a chart for mathematically explaining the interrelationship between a circular motion and a transferring motion of the apparatus.

During the above-described one circular motion of the crankshafts 7, the boat 4 transfers the semiconductor wafers 5 by the distance L ($L=L_1+L_2$). The transferring distance L is adjusted by the vertical distance between the first supporting bars 3 and the second supporting bars 13 in the crank horizontal position. To explain this adjustment, position of the first supporting bars 3 is illustrated as a line *a-a'* and position of the second supporting bars 13 in the crank horizontal position is illustrated as a line *b-b'* in FIG. 6. The second supporting bars 13, designated as a point P, make circular motion of the rotational radius R. The radius R is equal to the distance between the point P and a point O representative of the rotational center of the second supporting bars 13. The transferring distance L becomes equal to the horizontal distance of the arc $\widehat{cc'}$. The shorter vertical distance H between the lines *a-a'* and *b-b'* makes the longer transferring distance L and vice versa. Thus it should be understood that the transferring distance L is dependent upon the vertical distance between the first supporting bars 3 and the second supporting bars 13 in the crank horizontal position. It should be understood moreover that the transferring distance L is dependent upon the rotational radius R of the second supporting bars 13.

Repeating the above one circular motion, the second supporting bars 13 transfer the boat 4 automatically. Being transferred without sliding on the first and second supporting bars 3 and 13, the boat 4 made of fragile quartz is not damaged. And the lateral movement of the boat 4 is limited to the least owing to the guide bars 6. Therefore, semiconductor wafers 5 which are loaded on the boat 4 is transferred automatically and smoothly to be heat-treated.

As the first supporting bars 3 and the second supporting bars 13 are made of Teflon resin and detachable from the respective second bodies 3 and the supporting blocks 12, the supporting bars 3 and 13 can be washed in the aqua regia. Cleaning the supporting bars 3 and 13 prevents the semiconductor wafers from being contaminated in the heat-diffusion process by impure articles.

We claim:

1. An apparatus for transferring semiconductor wafers comprising:

a boat on which semiconductor wafers are loaded;

a body having a pair of side walls;

a pair of first supporting bars, positioned in a fixed relationship with said body, for supporting said boat between said side walls;

a movable unit having a lateral width narrower than the distance between said first supporting bars;

an actuator, operatively coupled to said movable unit, for rotating said movable unit between said first supporting bars; and a pair of second supporting bars, positioned on said movable unit, for uplifting and transferring said boat during when said second supporting bars are kept higher than said first supporting bars.

2. An apparatus claimed in claim 1 further comprising:

a pair of guide bars, positioned between said side walls of said body in a fixed relationship therewith and higher than said first supporting bars, for limiting lateral movement of said boat with respect to the transferring direction thereof.

3. An apparatus claimed in claim 1, wherein said movable unit is formed on the uppermost surface thereof with a pair of grooves in which said respective second supporting bars are detachably coupled for uplifting said boat thereon.

4. An apparatus claimed in claim 1, wherein said actuator comprises:

a pair of crankshafts rotatably supported by said side walls of said body for rotatably supporting said movable unit therebetween;

a motor coupled to one of said crankshafts; and a chain, coupled to said crankshafts, for synchronously rotating said crankshafts.

5. An apparatus claimed in claim 1, wherein said boat is provided with a plurality of slits in which said semiconductor wafers are carried and a plurality of windows through which heat-treating gas passes.

6. An apparatus for transferring semiconductor wafers comprising:

a boat by which semiconductor wafers are carried;

a body extending longitudinally and having inner space;

a pair of stationary bars, positioned longitudinally and horizontally in said inner space of said body, for supporting said boat thereon;

a pair of crankshafts rotatably carried by said body and arranged in parallel with each other;

a pair of movable bars operatively coupled to said crankshafts in parallel with each other to be rotated across said stationary bars; and a driving means, coupled to said crankshafts, for synchronously rotating said crankshafts, whereby said movable bars transfer said boat in a longitudinal direction of said body, moving circularly over said stationary bars and uplifting said boat thereon.

7. An apparatus claimed in claim 6 further comprising:

a pair of guide bars, positioned longitudinally in said inner space of said body and positioned higher and wider than said stationary bars, for guiding transfer direction of said boat.

8. An apparatus claimed in claim 6, wherein said boat is made of quartz.

9. An apparatus claimed in claim 6, wherein said stationary and movable bars are detachable from said body and said crankshafts respectively.

10. An apparatus claimed in claim 9, wherein said stationary and movable bars are made resistive to strong acids.

* * * * *